United States Patent [19]
Takenaka

[11] Patent Number: 6,058,062
[45] Date of Patent: May 2, 2000

[54] SEMICONDUCTOR MEMORY CIRCUIT

[75] Inventor: Tetsuro Takenaka, Miyazaki, Japan

[73] Assignee: Oki Electric Industry Co., Ltd., Tokyo, Japan

[21] Appl. No.: 09/092,909

[22] Filed: Jun. 8, 1998

[30] Foreign Application Priority Data

Jun. 24, 1997 [JP] Japan ................................ 9-166801

[51] Int. Cl.⁷ .................................................. G11C 7/00
[52] U.S. Cl. ...................................... 365/225.7; 365/200
[58] Field of Search ................................ 365/200, 225.7

[56] References Cited

U.S. PATENT DOCUMENTS

| | | | |
|---|---|---|---|
| 4,441,170 | 4/1984 | Folmsbee et al. | 365/200 |
| 5,387,823 | 2/1995 | Ashizawa | 365/200 |
| 5,471,426 | 11/1995 | McClure | 365/200 |
| 5,471,427 | 11/1995 | Murakami et al. | 365/200 |
| 5,696,723 | 12/1997 | Tukahara | 365/200 |
| 5,768,196 | 6/1998 | Bloker et al. | 365/200 |
| 5,828,624 | 10/1998 | Baker et al. | 365/225.7 |

FOREIGN PATENT DOCUMENTS

| | | |
|---|---|---|
| 5-120894 | 5/1993 | Japan . |
| 8-77776 | 3/1996 | Japan . |
| 9-69299 | 3/1997 | Japan . |

*Primary Examiner*—Trong Phan
*Attorney, Agent, or Firm*—Jones Volentine, LLP

[57] ABSTRACT

A semiconductor memory circuit comprises a plurality of redundancy address setting circuits and a decode circuit. Each of the redundancy address setting circuits has a first fuse coupled between a first voltage potential node and a first node, a second fuse coupled between the first node and a second node and a transistor coupled between the second node and a second voltage potential node. The decode circuit is coupled to the first nodes of each individual redundancy address setting circuits, for decoding signals which are applied to the first node and outputting a redundancy address signal according to the state of the first and second fuses.

17 Claims, 5 Drawing Sheets

SEMICONDUCTOR MEMORY CIRCUIT

BACKGROUND OF THE INVENTION

1. Field of the Invention

This invention relates to a semiconductor memory circuit, and particularly to a selection circuit for outputting a select signal indicative of an address for a redundancy memory cell (or a memory block with redundancy memory cells placed therein).

2. Description of the Related Art

A semiconductor memory circuit has a plurality of memory cells for respectively storing data therein. This type of semiconductor memory circuit is formed on a semiconductor substrate. With an increase in memory capacity and an improvement in integration density, the number of memory cells included in one semiconductor memory circuit becomes massive. Defective memory cells cannot be prevented from occurring in a process for fabricating a semiconductor memory circuit. Thus, a method of forming redundancy memory cells in a semiconductor memory circuit in advance in view of the occurrence of defective memory cells is now adopted. A semiconductor memory circuit formed on a semiconductor wafer is first examined or tested in a wafer state. If any defective memory cell is found, then a redundancy relieving process is executed so as not to select the defective memory cell and to select a redundancy memory cell (or a memory block with redundancy memory cells placed therein) as an alternative to the defective memory cell. Since an address for the defective memory cell is unspecified, a selection circuit is used which has fuses and sets an address for each redundancy memory cell. Selecting the corresponding redundancy memory cell is achieved by cutting a specific fuse provided within the selection circuit.

However, current flows from a source potential to a ground potential through the corresponding fuse depending on the placement of the fuses in the selection circuit, so that power to be used up by the semiconductor memory circuit increases. The more the number of redundancy memory cells increases, the more the number of fuses becomes great. Thus, since power to be consumed by a semiconductor memory circuit also increases, there has been a demand for improvements in such disadvantages.

SUMMARY OF THE INVENTION

According to one aspect of the present invention, for achieving the above object, there is provided, as a specific configuration, a semiconductor memory circuit comprising a plurality of redundancy address setting circuits and a decode circuit. Each of the redundancy address setting circuits has a first fuse coupled between a first voltage potential node an a first node, a second fuse coupled between the first node and a second node and a transistor coupled between the second node and a second voltage potential node. The decode circuit is coupled to the first nodes of each individual redundancy address setting circuits, for decoding signals which are applied to the first nodes and outputting a redundancy address signal according to the state of the first and second fuses.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

First Embodiment

Figure 1:
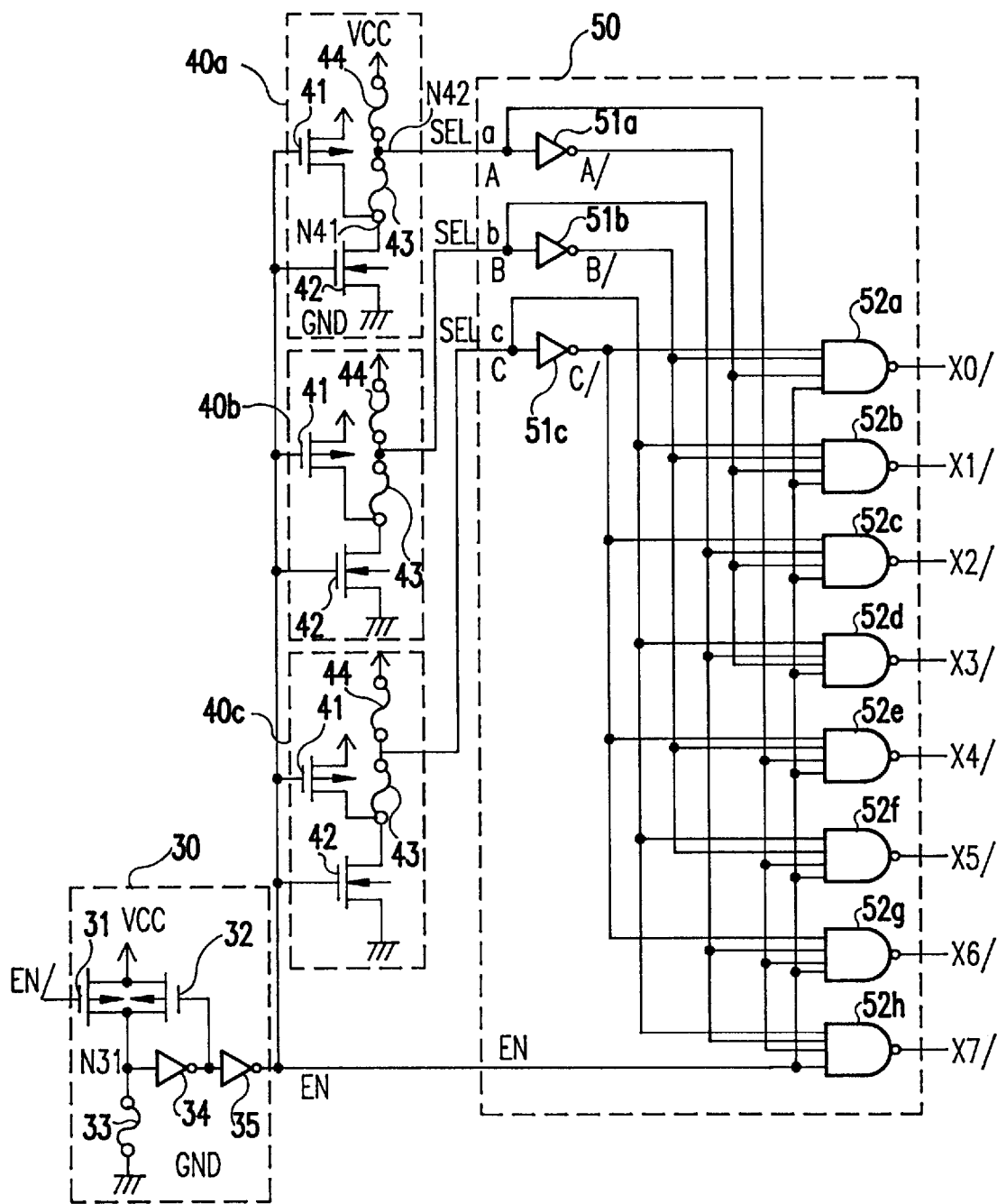
FIG. 1 is a schematic diagram of a semiconductor memory circuit according to a first embodiment of the present invention.

FIG. 1 is a diagram showing a selection circuit of a semiconductor memory circuit according to a first embodiment of the present invention.

This selection circuit is provided with an enable signal setting circuit 30. The enable signal setting circuit 30 has a PMOS 31 supplied with an enable signal EN/. The drain of the PMOS 31 is electrically connected to a first source potential (e.g., a source or voltage potential) VCC and the source thereof is electrically connected to a node N31. The drain and source of a PMOS 32 are electrically connected to the drain and source of the PMOS 31 respectively. A fuse 33 is electrically connected between the node N31 and a second source potential (e.g., a ground potential) GND. The input side of an inverter 34 is electrically connected to the node N31 and the output side thereof is electrically connected to the gate of the PMOS 32 and the input side of an inverter 35. The inverter 35 outputs an enable signal EN therefrom.

The enable signal EN outputted from the enable signal setting circuit 30 is provided as one to be supplied to select signal setting circuits 40a, 40b and 40c and a selection circuit (e.g., a decoder) 50.

The select signal setting circuits 40a through 40c are all similar in configuration to each other and have PMOSs 41 and N channel MOS transistors (hereinafter called [NMOS]) 42 whose conducting states are controlled by the enable signal EN, respectively. The drains of the PMOSs 41 are respectively electrically connected to the source potential VCC and the sources thereof are respectively electrically connected to nodes N41. The drains of the NMOSs 42 are electrically connected to the nodes N41 and the sources thereof are electrically connected to the ground potential GND, respectively. Fuses 43 are respectively electrically connected between the nodes 41 and nodes N42. Further, fuses 44 are respectively electrically connected between the nodes N42 and the source potential VCC. A select signal SELa is outputted from the node N42 of the select signal setting circuit 40a.

The select signals SELa, SELb and SELc outputted from the respective select signal setting circuits 40a through 40c respectively are supplied to a decoder 50 as select signals A, B and C with respect to the decoder 50.

The decoder 50 has inverters 51a, 51b and 51c for inverting the select signals A, B and C to thereby create inverted select signals A/, B/ and C/. The decoder 50 includes four-input NAND gates 52a, 52b, . . . , 52h respectively supplied with the select signal A or the inverted select signal A/, the select signal B or the inverted select signal B/, the select signal C or the inverted select signal C/ and the enable signal EN. Further, output signals X0/, X1/, . . . , X7/ are respectively outputted to the outputs of these NAND gates 52a through 52h.

When the fuse 33 provided within the enable signal setting circuit 30 is placed in a connected state within such a selection circuit (when no redundancy relieving process is performed), the enable signal EN outputted from the enable signal setting circuit 30 is taken "L". Therefore, the decoder 50 is prohibited from operating, so that all the output signals X0/ through X7/ are brought to On the other hand, when the fuse 33 provided within the enable signal setting circuit 30 is cut or opened (when the redundancy relieving process is executed), the enable signal EN goes "H" to free the decoder 50 from the prohibition of its operation. Thus, one of the output signals X0/ through X7/, which has been selected by a combination of the select signals A, B and C, is rendered "L" and all the remaining output signals go "H". When, for example, the fuse 44 provided within the select signal setting circuit 40a and the fuses 43 provided within the select signal setting circuits 40b and 40c are caused to open, the select signal SELa is taken "L" and the select signals SELb and SELc are taken "H". Thus, only the output signal X3/ of the NAND gate 52d provided within the decoder 50 goes "L". The corresponding output of the decoder 50 indicates an address for a defective memory cell or an address for a memory block with redundancy memory cells arranged therein.

Thus, since the selection circuit employed in the present embodiment cuts or opens either one of the series-connected fuses 43 and 44 provided within the select signal setting circuits 40a through 40c, no current flows between the source potential and the ground potential. As a result, unnecessary power consumption is eliminated and power savings becomes possible.

Second Embodiment

Figure 2:
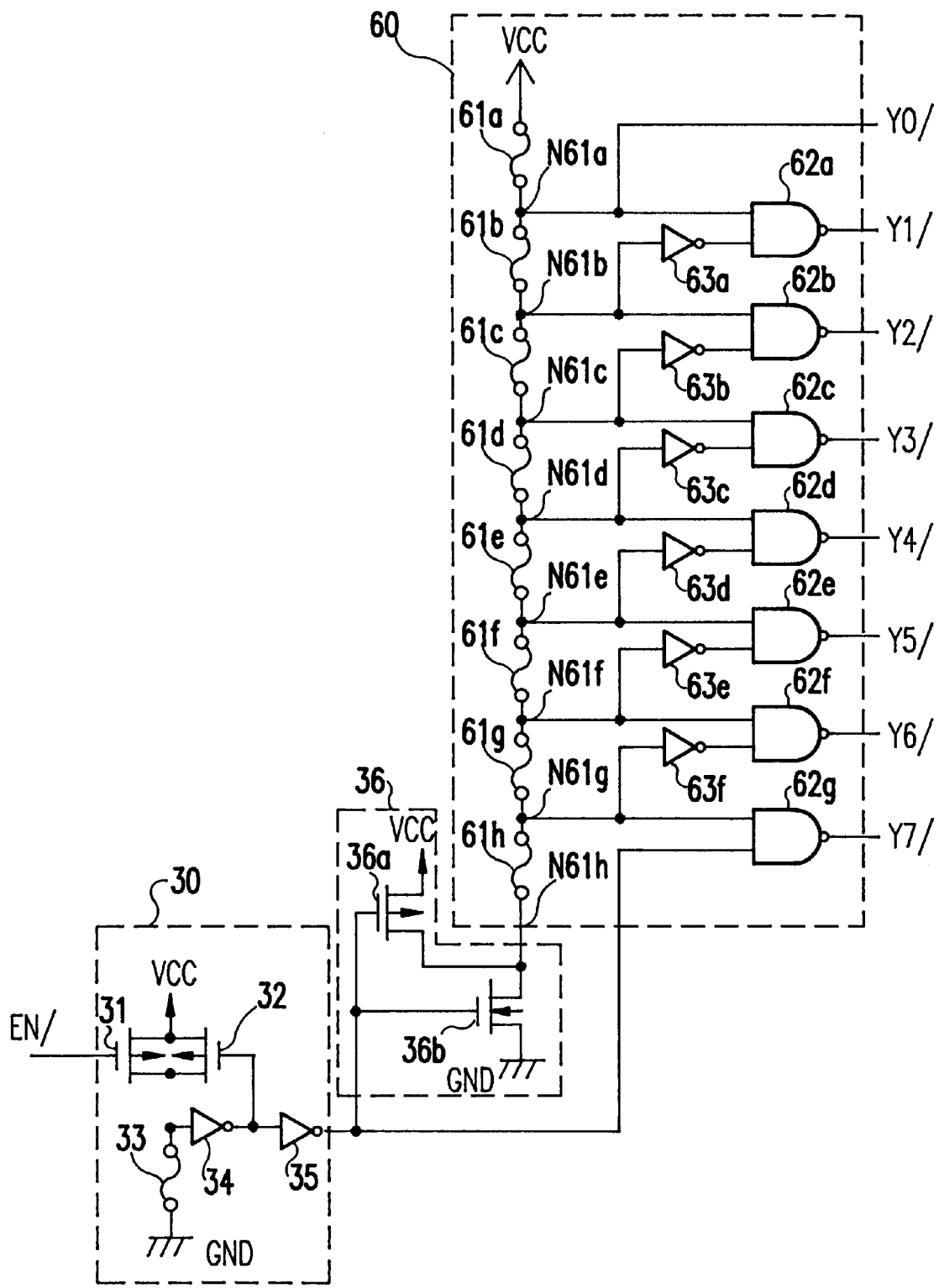
FIG. 2 is a schematic diagram of a semiconductor memory circuit according to a second embodiment of the present invention.

FIG. 2 shows a selection circuit of a semiconductor memory circuit according to a second embodiment of the present invention.

The selection circuit has an enable signal setting circuit 30 similar to that shown in FIG. 1. An inverter 35 provided within the enable signal setting circuit 30 outputs an enable signal EN. The output side of the inverter 35 is electrically connected to the input side of a CMOS inverter 36 comprised of a PMOS 36a and an NMOS 36b.

The selection circuit has also an output signal setting circuit 60. The output signal setting circuit 60 has a fuse 61a for connecting a source potential VCC and a node N61a. Further, a fuse 61b, a fuse 61c, a fuse 61d, a fuse 61e, a fuse 61f, a fuse 61g and a fuse 61h are electrically connected between the node N61a and a node N61b, between the node N61b and a node N61c, between the node N61c and a node N61d, between the node N61d and a node N61e, between the node N61e and a node N61f, between the node N61f and a node N61g and between the node N61g and a node N61h respectively. The output side of the CMOS inverter 36 is electrically connected to the node N61h.

A first input of a logic gate (e.g., a two-input NAND gate) 62a is electrically connected to the node N61a. A second input of the NAND gate 62a is electrically connected to the node N61b through an inverter 63a.

A first input of a NAND gate 62b is electrically connected to the node N61b and a second input thereof is electrically connected to the node N61c through an inverter 63b. A first input of a NAND gate 62c is electrically connected to the node N61c and a second input thereof is electrically connected to the node N61d through an inverter 63c. A first input of a NAND gate 62d is electrically connected to the node N61d and a second input thereof is electrically connected to the node N61e through an inverter 63d. A first input of a NAND gate 62e is electrically connected to the node N61e and a second input thereof is electrically connected to the node N61f through an inverter 63e. A first input of a NAND gate 62f is electrically connected to the node N61f and a second input thereof is electrically connected to the node N61g through an inverter 63f.

A first input of a NAND gate 62g is electrically connected to the node N61g and a second input thereof is electrically connected to the output side of the inverter 35 provided within the enable signal setting circuit 30.

An output signal Y0/ is outputted from the node N61a of the output signal setting circuit 60 and output signals Y1/ through Y7/ are respectively outputted from the NAND gates 62a through 62g.

When a fuse 33 provided within the enable signal setting circuit 30 is placed in a connected state within the selection circuit (when no redundancy relieving process is done), the enable signal EN outputted from the enable signal setting circuit 30 is taken "L". Further, the level of the output side of the CMOS inverter 36, i.e., the node N61h goes "H" and hence the output signals Y0/ through Y7/ are all taken "H".

On the other hand, when the fuse 33 provided within the enable signal setting circuit 30 is cut and any (e.g., the fuse 61d) of the fuses 61a through 61h is cut (when the redundancy relieving process is performed), the level of the node N61g is taken "L". Due to the cutting of the fuse 61d, the nodes N61a through N61c go "H" and the nodes N61d through N61h are taken "L". Thus, only the output signal Y3/ of the NAND gate 62c goes "L". The output of the output signal setting circuit 60 indicates an address for a defective memory cell or an address for a memory block with redundancy memory cells placed therein.

Thus, since the selection circuit according to the second embodiment opens any of the series-connected fuses 61a through 61h, no current flows between a source potential and a ground potential. As a result, unnecessary power consumption is eliminated and power savings is allowed. Further, the second embodiment has an advantage in that it can be constructed by the less number of parts and the number of fuses to be cut may be two.

Third Embodiment

Figure 3:
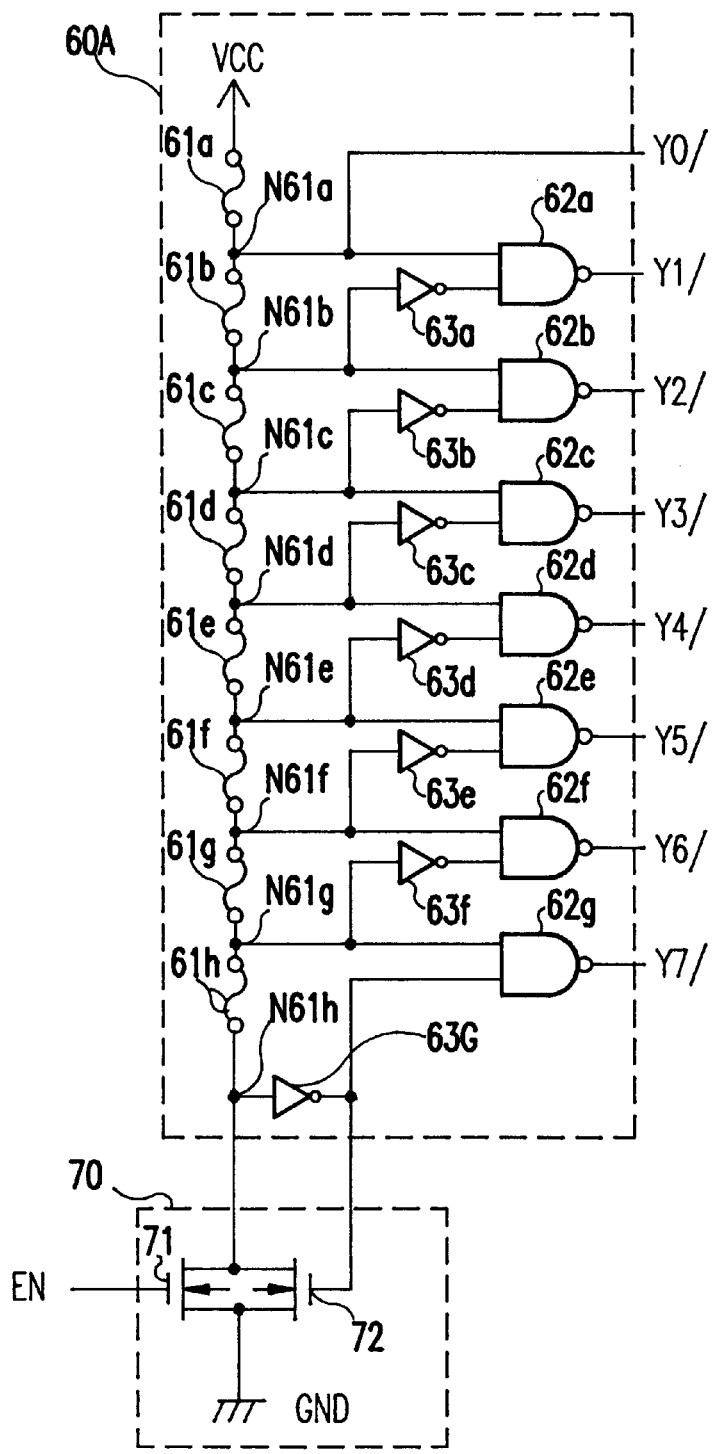
FIG. 3 is a schematic diagram of a semiconductor memory circuit according to a third embodiment of the present invention.

FIG. 3 is a diagram showing a selection circuit of a semiconductor memory circuit according to a third embodiment of the present invention. In FIG. 3, elements of structure common to those in the second embodiment are identified by common reference numerals.

The selection circuit comprises an enable signal setting circuit 70 and an output signal setting circuit 60A substantially similar in configuration to the output signal setting circuit 60 shown in FIG. 2.

The output signal setting circuit 60A is configured in such a manner that an inverter 63g is added to the output signal setting circuit 60 shown in FIG. 2 and a node N61h is electrically connected to a second input of a NAND gate 62g through the inverter 63g.

The enable signal setting circuit 70 has an NMOS 71 controlled by an enable signal EN. The drain and source of the NMOS 71 are electrically connected to the node N61h and a ground potential GND respectively. The drain and source of an NMOS 72 are electrically connected to the drain and source of the NMOS 71 respectively. The output side of the inverter 63g is electrically connected to the gate of the NMOS 72.

If fuses 61a through 61h provided within the output signal setting circuit 60A are all held in connected states within the present selection circuit (if no redundancy relieving process is performed), then all the nodes N61a through N61h are taken "H". Therefore, signals Y0/ through Y7/ outputted from the output signal setting circuit 60A are all taken "H".

On the other hand, when any (e.g., the fuse 61d) of the fuses 61a through 61h is cut or opened and the enable signal EN is supplied (when the redundancy relieving process is done), the nodes N61a through N61c go "H" and the nodes N61d through N61h go "L" due to the opening of the fuse 61d. Thus, only the output signal Y3/ of the NAND gate 62c is taken "L". The output of the output signal setting circuit 60A indicates an address for a detective memory cell or an address for a memory block with redundancy memory cells placed therein.

Thus, since the selection circuit according to the third embodiment opens any of the series-connected fuses 61a through 61h, no current flows between a source potential and a ground potential. As a result, unnecessary power consumption is eliminated and power savings is allowed. Further, the third embodiment brings about an advantage in that it can be configured by the number of parts much less than that employed in the second embodiment and the number of fuses to be cut may be one.

Fourth Embodiment

Figure 4:
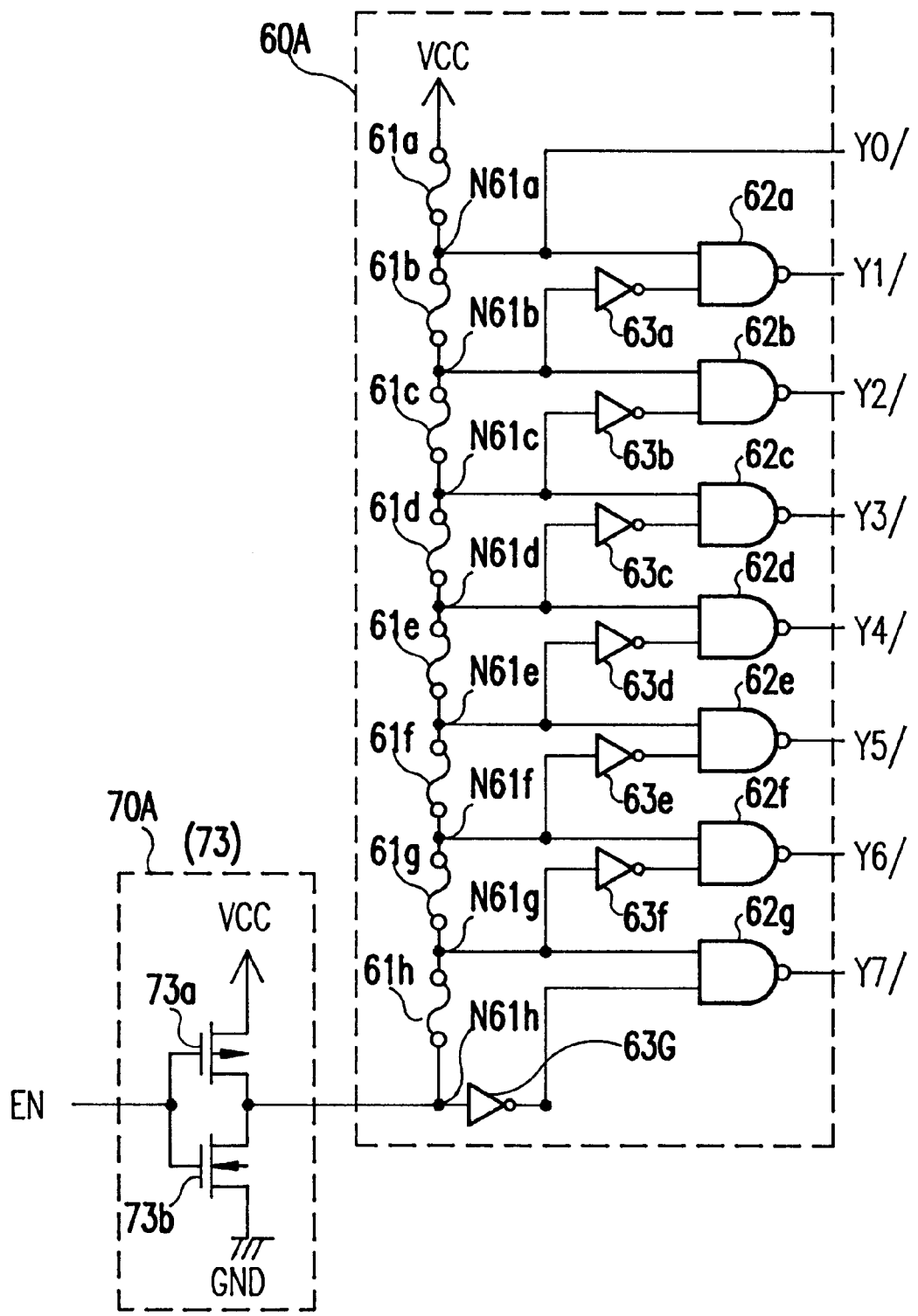
FIG. 4 is a schematic diagram of a semiconductor memory circuit according to a fourth embodiment of the present invention.

FIG. 4 is a diagram showing a selection circuit of a semiconductor memory circuit according to a fourth embodiment of the present invention. In FIG. 4, elements of structure common to those in the third embodiment are identified by common reference numerals.

The present selection circuit is provided with an enable signal setting circuit 70A as an alternative to the enable signal setting circuit 70. The selection circuit is similar in other configurations to the selection circuit shown in FIG. 3.

The enable signal setting circuit 70A is a CMOS inverter 73 comprised of a PMOS 73a and an NMOS 73b. The input side of the CMOS inverter 73 is supplied with an enable signal EN and the output side thereof is electrically connected to a node N61h of an output signal setting circuit 60A.

Even if a fuse 61d or the like is cut, the present selection circuit is capable of setting and resetting output signals Y0/ through Y7/ according to the enable signal EN. When the enable signal EN is taken "L", for example, all the output signals Y0/ through Y7/ go "H". On the other hand, when the enable signal EN is taken "H", any of the output signals Y0/ through Y7/ goes "L" according to the cutout fuses 61a to 61h.

As described above, the selection circuit according to the present embodiment has an advantage similar to the first embodiment.

Fifth Embodiment

Figure 5:
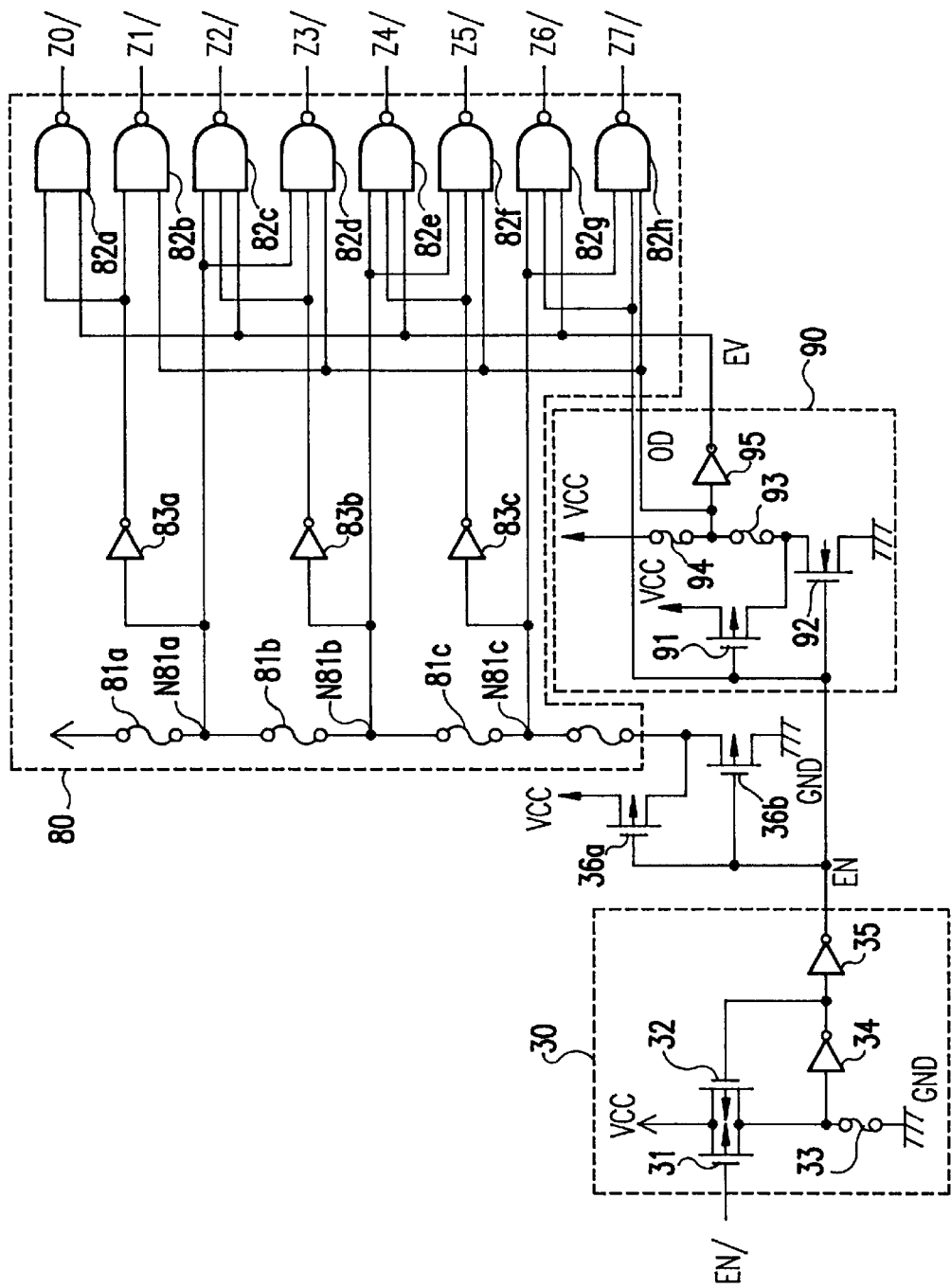
FIG. 5 is a schematic diagram of a semiconductor memory circuit according to a fifth embodiment of the present invention.

FIG. 5 is a diagram showing a selection circuit of a semiconductor memory circuit according to a fifth embodiment of the present invention. In FIG. 5, elements of structure common to those in the first and second embodiments are identified by common reference numerals.

In the selection circuit shown in FIG. 2, the fuses 61a through 61h of the output signal setting circuit 60 are in a one-to-one correspondence with the output signals Y0/ through Y7/. In an output signal setting unit 80 shown in FIG. 5, however, two output signals Z0/ and Z1/ correspond to a fuse 81a, for example. The selection circuit shown in FIG. 5 further includes an even/odd setting circuit 90 and supplies an even select signal EV and an odd select signal OD outputted from the even/odd setting circuit 90 to NAND gates 82. Thus, either one of the output signals Z0/ and Z1/, for example, is selectively outputted.

The operation of the selection circuit referred to above corresponds to one obtained by the combination of the operations of the selection circuits employed in the first and second embodiments. The present embodiment has an advantage similar to the first and second embodiments.

Incidentally, the present invention is not limited to the above-described embodiments and can be brought into various forms. For example, the following (a) through (c) are given as their modifications:

(a) The number of the output signals X0/ through X7/ or the like to be selected is not limited to eight and is applicable to an arbitrary number. Further, the output signals X0/ through X7/ or the like are not limited to negative logic. They may make use of positive logic according to an object to be applied.

(b) The decoder 50 is not limited to the circuit configuration shown in FIG. 1 and can take an arbitrary circuit configuration.

(c) If the fuse 33 can be reliably cut or opened and the enable signal EN is reliably taken "H" in FIGS. 1 and 2, then the PMOSs 31, 36a and 41 can be omitted. If the fuse 33 can be reliably cut and the enable signal EN is reliably taken "H" in FIG. 5, then the PMOSs 31, 36a and 91 can be omitted.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory circuit comprising:
    a plurality of redundancy address setting circuits each having a first fuse coupled between a first potential node and a first node, a second fuse coupled between the first node and a second node and a transistor coupled between the second node and a second potential node;
    a decode circuit coupled to the first node of each individual redundancy address setting circuits, for decoding signals which are applied to the first nodes and outputting a redundancy address signal according to the state of the first and second fuses.

2. A semiconductor memory circuit of claim 1, further comprising:
    an enable signal setting circuit for outputting an enable signal to the transistors of each redundancy address setting circuit and the decode circuit.

3. A semiconductor memory circuit of claim 2, wherein said enable signal setting circuit comprises a third fuse coupled between the second potential node and a third node and a transistor coupled between the first potential node and the third node and for outputting the enable signal.

4. A semiconductor memory circuit of claim 1, wherein one of the first and second fuses in said redundancy address signal setting circuit is cut.

5. A semiconductor memory circuit of claim 1, wherein said decode circuit includes NAND circuits which outputs the redundancy address signal.

6. A semiconductor memory circuit comprising:
   a first potential node applied to a first potential level;
   a second potential node applied to a second potential level;
   a plurality of fuses coupled between a first node and the first potential node in series;
   a transistor coupled to the first node and said second potential node;
   a decode circuit coupled to common nodes at which adjacent fuses are connected, for decoding signals which are applied to the common nodes and outputting a redundancy address signal according to the state of said fused; and
   an enable signal setting circuit for outputting an enable signal to said transistor and said decode circuit, wherein said transistor selectively turns on and off in response to a level of the enable signal.

7. A semiconductor memory circuit of claim 6, wherein said enable signal setting circuit comprises another fuse coupled between said second potential node and a second node and another transistor coupled between said first potential node and said second node and for outputting the enable signal.

8. A semiconductor memory circuit of claim 6, wherein one of the fuses is cut.

9. A semiconductor memory circuit of claim 6, wherein said decode circuit includes NAND circuits which output the redundancy address signal.

10. A redundancy circuit for a semiconductor memory circuit having a redundancy relieving process, comprising:
    a first potential node applied to a first potential level;
    a second potential node applied to a second potential level;
    a plurality of fuses coupled between a first node and the first potential node through common nodes in series;
    a redundancy operation circuit coupled to the first node and said second potential node, said redundancy operation circuit selectively applying the second potential level to the first node and disconnecting the first node from the second potential level in response to an enable signal; and
    a decode circuit coupled to common nodes for decoding signals which are applied to the common nodes and outputting a redundancy address signal according to the state of said fuses.

11. A redundancy circuit according to claim 10, further comprising an enable signal generator coupled to the redundancy operation circuit for outputting the enable signal when the redundancy process is performed.

12. A redundancy circuit according to claim 11, wherein the enable signal generator includes a first transistor having a source connected to said first potential node, a drain connected to an output node and a gate coupled to receive an original enable signal, and a fuse connected between the output node and said second potential node.

13. A redundancy circuit according to claim 12, wherein the enable signal generator further includes a second transistor having a source connected to said first potential node, a drain connected to the output node and a gate, a first inverter having an input connected to the output node and an output connected to the gate of the second transistor, and a second inverter having an input connected to the output of the first inverter and an output for outputting the enable signal.

14. A redundancy circuit according to claim 10, wherein said decode circuit receives the enable signal.

15. A redundancy circuit according to claim 10, wherein said redundancy operation circuit includes a first transistor having a source connected to said second potential node, a drain connected to the first node and a gate coupled to receive the enable signal.

16. A redundancy circuit according to claim 15, wherein said redundancy operation circuit further includes a second transistor having a source connected to said first potential node, a drain connected to the first node and a gate coupled to receive the enable signal.

17. A redundancy circuit according to claim 10, further comprising a plurality of second fuses coupled between a second node and the first potential node through second common nodes in series and a second redundancy operation circuit coupled to the second node and said second potential node, said second redundancy operation circuit applying the second potential level to the second node in response to the enable signal, and wherein said decode circuit is coupled to the second common nodes.

* * * * *